(12) United States Patent
Nakayama et al.

(10) Patent No.: US 6,654,945 B1
(45) Date of Patent: Nov. 25, 2003

(54) STORAGE MEDIUM IN WHICH DATA FOR DESIGNING AN INTEGRATED CIRCUIT IS STORED AND METHOD OF FABRICATING AN INTEGRATED CIRCUIT

(75) Inventors: Katsutoshi Nakayama, Tachikawa (JP); Satoshi Kojima, Hachioji (JP); Syouhei Oda, Kokubunji (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/913,021

(22) PCT Filed: Feb. 17, 1999

(86) PCT No.: PCT/JP99/00675

§ 371 (c)(1),
(2), (4) Date: Oct. 12, 2001

(87) PCT Pub. No.: WO00/49653

PCT Pub. Date: Aug. 24, 2000

(51) Int. Cl.[7] .............................................. G06F 17/50
(52) U.S. Cl. ........................................................ 716/18
(58) Field of Search .............................. 716/5, 7, 8, 11, 716/18, 1, 17

(56) References Cited

U.S. PATENT DOCUMENTS

| | | | |
|---|---|---|---|
| 4,922,432 A | 5/1990 | Kobayashi et al. | 364/490 |
| 5,302,864 A | 4/1994 | Shinbara | 307/465 |
| 5,499,192 A | 3/1996 | Knapp et al. | 364/489 |
| 5,872,716 A | * 2/1999 | Yano et al. | 716/1 |
| 6,292,931 B1 | * 9/2001 | Dupenloup | 716/18 |

FOREIGN PATENT DOCUMENTS

| | | |
|---|---|---|
| EP | 0 533 583 | 3/1993 |
| JP | 2-249254 | 10/1990 |
| JP | 5-198672 | 8/1993 |
| JP | 8-77235 | 3/1996 |
| JP | 9-199598 | 7/1997 |
| JP | 10-107614 | 4/1998 |
| JP | 10-198726 | 7/1998 |
| WO | WO 98/54664 | 12/1998 |

OTHER PUBLICATIONS

Kojima, "EDA Tools Focused on Verification to Meet System LSI Design Requirements," *Nikkei Electronics*, No. 723, Aug. 10, 1998, pp. 99–109.

Keutzer, Kurt, "Three Competing Design Methodologies for ASIC's; Architectural Synthesis, Logic Synthesis and Module Generation", *26th ACM/IEEE Design Automation Conference*, Jun. 25–29, pp. 308–313.

* cited by examiner

*Primary Examiner*—Vuthe Siek
*Assistant Examiner*—Thuan Do
(74) *Attorney, Agent, or Firm*—Miles & Stockbridge P.C.

(57) ABSTRACT

Data of an IP module (1) has a hardware part for defining a layout pattern of a first circuit (2) in an integrated circuit and a software part (information described in an HDL or the like) for determining the function of a second circuit (3), and also has connection information for specifying the relation of connecting the first and second circuits. Since a part requiring adjustment such as an interface part takes the form of a software part and has data and the degree of freedom, at the time of designing an integrated circuit, partial modification such as promotion of reduction in power consumption or reduction in chip occupying area in accordance with an external load can be easily made on past design asset data. Therefore, by loading the data from the storage medium into a computer and using the data for designing of an integrated circuit, the functions and performances of the circuit can be guaranteed more than the case where all of modules are software modules, the degree of freedom in designing is higher than the case where all of modules are hardware modules, and the number of designing steps can be also reduced.

25 Claims, 10 Drawing Sheets

FIG. 7

| | | DATA NAME |
|---|---|---|
| (IP MODULE DATA) | 61 | SOFTWARE PART RTL DATA (SECOND DATA DT2) |
| IPD | 60 | LIBRARY FOR HARDWARE PART LOGIC SYNTHESIS (FOURTH DATA DT4) |
| | 62 | CONNECTION INFORMATION OF HARDWARE PART AND SOFTWARE PART (THIRD DATA DT3) |
| | 63 | LIBRARY FOR HARDWARE PART LOGIC VERIFICATION (FOURTH DATA DT4) |
| | 64 | HARDWARE PART NET LIST |
| | 65 | HARDWARE PART LAYOUT INFORMATION (FIRST DATA DT1) |
| INPUT OF EACH PRODUCT | | TOP NET LIST |

FIG. 8

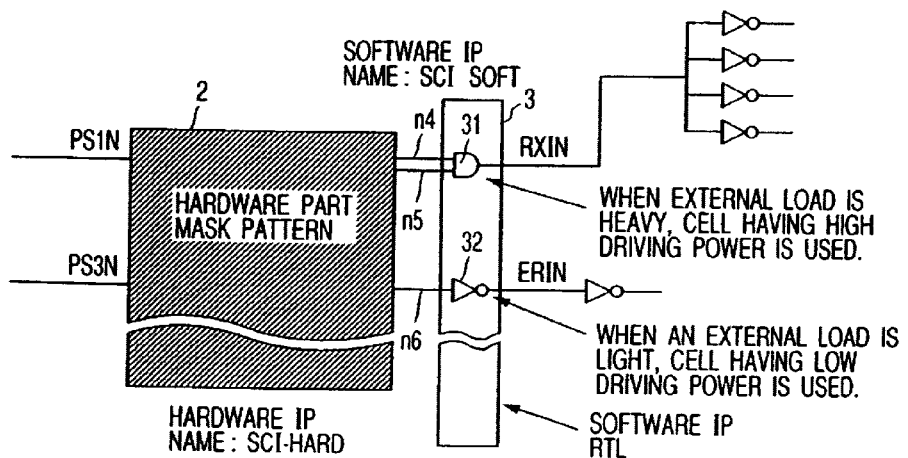

FIG. 9

DATA OF IP MODULE (1) CONNECTION INFORMATION OF HARDWARE IP AND SOFTWARE IP

CONNECTION INFORMATION: CONNECT HARDWARE IP AND SOFTWARE IP HAVING THE SAME NAME  } DT3

(2) SOFTWARE IP

```
module SCI_SOFT( n4, n5, n6, RXIN, ERIN, ...)   // SCI_SOFT IS NAME OF SOFTWARE IP
    input   n4, n5, n6, ... ;                    // INPUT SIGNAL
    output  RXIN, ERIN, ... ;                    // OUTPUT SIGNAL assign RXIN = n4 n5 ;
    assign ERIN = ‾ n6 ;
    ...

endmodule
```
} DT2

(3) HARDWARE IP

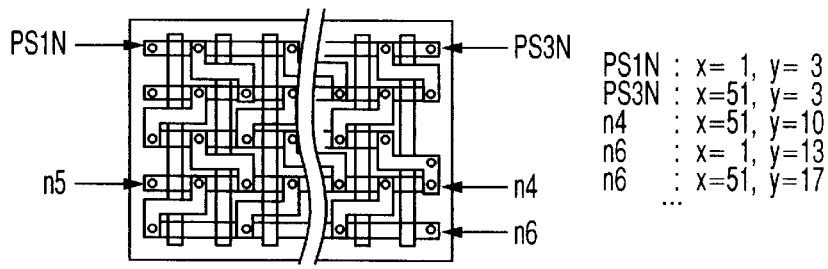

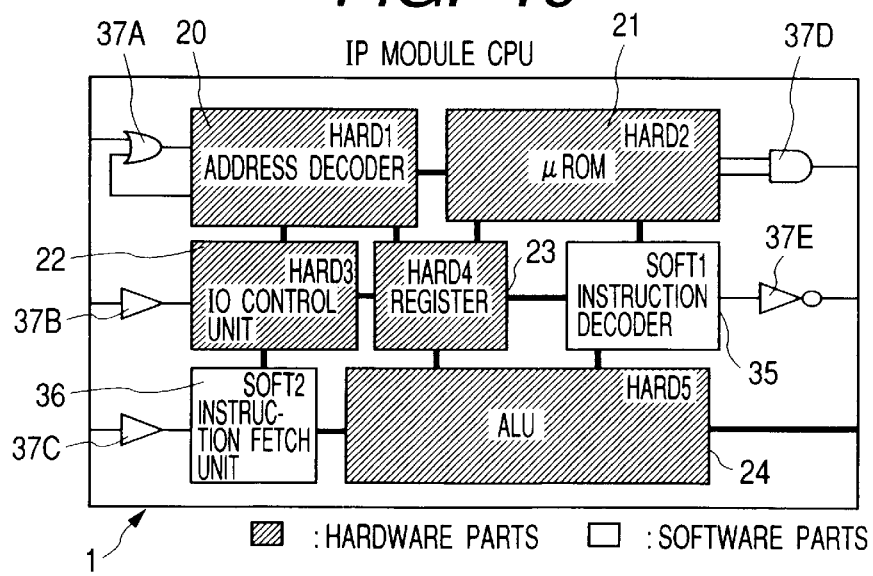

▨ : HARDWARE PARTS   ☐ : SOFTWARE PARTS

FIG. 11

DATA OF IP MODULE CPU (1) SOFTWARE PART

```
  module CPU( ... )              // CPU IS NAME OF OVERALL MODULES
    ...
    SOFT1 U1( n1, n2, n3, ... )  // REFER TO INNER SOFTWARE PART
    SOFT2 U2( ... )              // REFER TO INNER SOFTWARE PART
    ...
    HARD1 U3( N1(n1), N2(n2), ... )  //REFER TO INNER HARDWARE PART
    HARD2 U4( ... )              // REFER TO INNER HARDWARE PART
    HARD3 U5( ... )              // REFER TO INNER HARDWARE PART
    HARD4 U6( ... )              // REFER TO INNER HARDWARE PART
    HARD5 U7( ... )              // REFER TO INNER HARDWARE PART
  endmodule module SOFT1( n1, n2, n3, ... )  // SOFT1 IS NAME OF SOFTWARE MODULE
    input  n1, n2, ... ;
    output n3, ... ;

assign net1=n1 n2;
    assign n3= ~net6;
    ...
  endmodule
  ...
```

} DT2

} DT3

} DT2

(2) LAYOUT INFORMATION OF HARDWARE PART

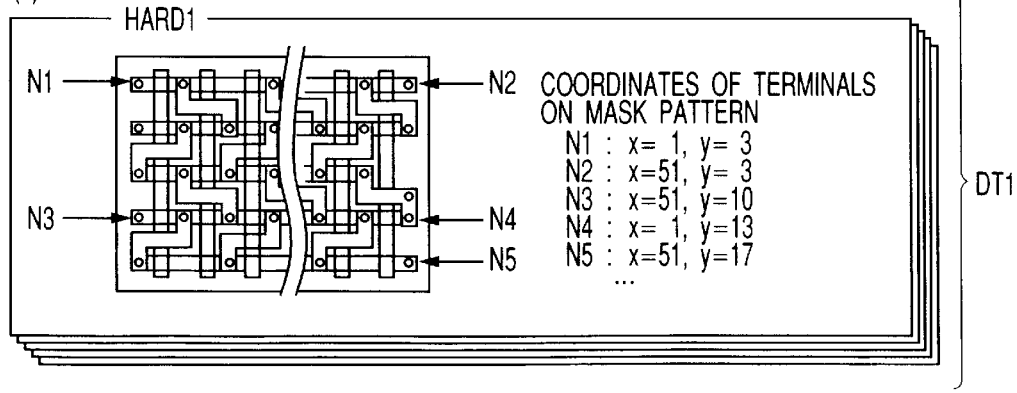

} DT1

DATA OF IP MODULE CPU (1) CONNECTION INFORMATION OF HARDWARE IP AND SOFTWARE IP

CONNECTION INFORMATION: CONNECT HARDWARE IP AND SOFTWARE IP HAVING THE SAME NAME   } DT3

(2) SOFTWARE IP

```
module SOFT1( n1, n2, n3, ... )   // SOFT1 IS NAME OF SOFTWARE MODULE
   input   n1, n2, ... ;
   output  n3, ... ;

assign net1=n1 n2 ;
   assign n3=~net6 ;
   ...
endmodule
```
} DT2

(3) HARDWARE IP

} DT1

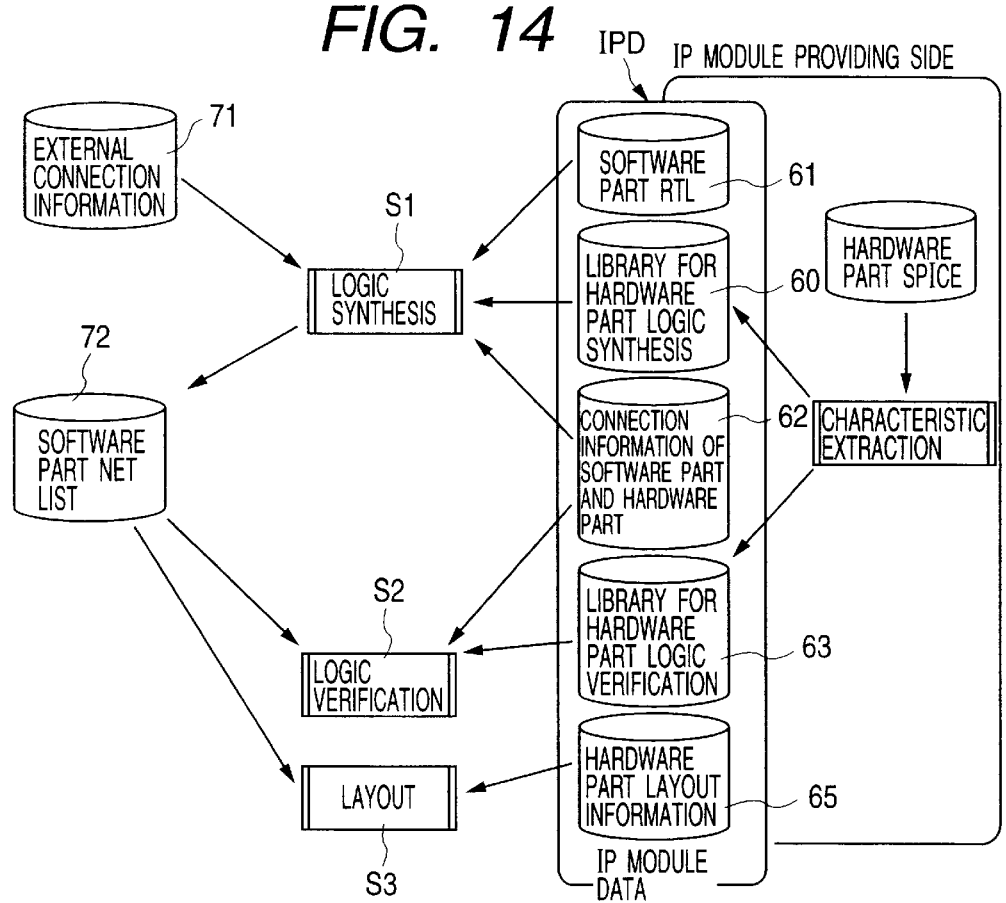
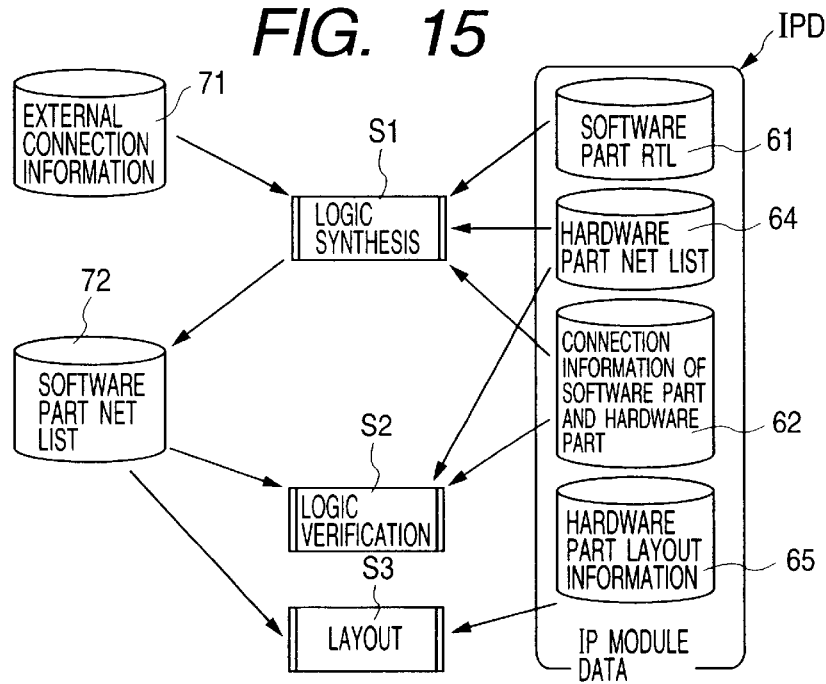

STORAGE MEDIUM IN WHICH DATA FOR DESIGNING AN INTEGRATED CIRCUIT IS STORED AND METHOD OF FABRICATING AN INTEGRATED CIRCUIT

TECHNICAL FIELD

The present invention relates to a storage medium in which data regarding designing to be supplied to a computer (electronic computer) executing a predetermined program to design a circuit to be formed on a semiconductor chip is stored and a method of fabricating a semiconductor integrated circuit. For example, the invention relates to a technique effective for use in designing and fabricating of a microcomputer or the like.

BACKGROUND ART

At the time of designing a semiconductor integrated circuit or the like, a collection of computing functions, signal control functions, and the like to be provided in the circuit is called a block (or module or core). The blocks include a hard macro block (or hard module or hard core) for providing, as a part, data indicative of a plurality of mask patterns for forming a layout to a chip designer after completion of designing the layout of the portion. Recently, such a hard macro block is also called a hardware IP (Intellectual Property) module. In the case of providing such a hard macro to a chip designer, as data expressing the hard macro block, together with data describing the function of the block (circuit) in a computer language such as HDL (Hardware Description Language), data of a mask pattern expressing the layout of the circuit (for example, drawing data for forming a mask pattern), and the like is provided. In contrast to such a hard macro block, there is a block called a soft macro block (or software module or software core). In the soft macro block, the function of the block (circuit) is specified by description in the HDL or the like and the description is provided as a part to a chip designer. Such a soft macro block is also called a software IP module in contrast to the hardware IP module. There is a case such that the circuit scale of the macro block such as the hardware IP module or software IP module is as large as a unit of function of an SRAM (Static Random Access Memory), DRAM (Dynamic Random Access Memory), CPU (Central Processing Unit), DSP (Digital Signal Processor), or the like.

The hard macro block such as the hardware IP module includes, as data to be provided to the designer, information regarding a mask pattern for forming a verified layout pattern. Consequently, even the circuit characteristics of the block (circuit) provided as the hardware IP module are guaranteed. At the time of designing a microcomputer, a system LSI, or the like, by using data of a hard macro block such as the hardware IP module as a past design asset, a designing and verification period can be largely shortened. The function describing data in the HDL or the like included in the hardware IP module is used to verify, for example, a logic operation of a configuration in which the hardware IP module and the outside are integrated when the hardware IP module and the outside are connected to each other.

The hardware IP or the like is described in "Verification on System LSI using IP core" in Nikkei Electronics No. 723, Aug. 10, 1998, pp. 99 to 109.

The inventors of the present invention have examined a use of data of the hardware IP module, software IP module, and the like for designing of a semiconductor integrated circuit. For example, by adding a peripheral function corresponding to a required specification of the user to the CPU as a core of a microcomputer, the microcomputer can be developed as a product. At this time, by re-using a designed hardware IP module as a peripheral circuit module to shorten the design period, the design period until the layout can be shortened as described above.

In the case of using the hardware IP module, since designing up to a mask pattern for forming a layout pattern of a circuit has been completed, the function and performance of the circuit is stable and the small number of designing steps is sufficient. In the hard macro block such as a hardware IP module, however, a circuit of a relatively high driving capability is used to guarantee its operation irrespective of an actual external load. It therefore counts against a request such as reduction in power consumption or reduction in chip occupied area. However, in the case of adopting a circuit of a driving capability according to an external load for an interface section, a problem such that it becomes difficult to re-use data of the mask pattern included in the hardware IP module arises. It is not easy to change the shape of a layout pattern of a part of the-hardware IP module in which the mask pattern has been completed and to guarantee the operation.

On the other hand, by using a software IP module, designing according to an external load can be performed for the interface section. However, since the performances such as timing depend on a layout, high reliability in functions is not always obtained only by the software IP module. Since layout is designed so that timings and the like are satisfied in a whole block, a problem such that a number of designing steps is necessary to complete the designing of the mask pattern which specifies the layout.

An object of the invention is to provide a storage medium in which designing information that can be contributed to increase in efficiency of a process of designing a semiconductor integrated circuit by using a computer is stored.

Another object of the invention is to provide a storage medium in which designing data is stored, which can guarantee function and performance of a circuit more than the case where all modules are software modules, has the degree of freedom in designing higher than the case where all modules are hardware modules, and can contribute to reduction in the number of designing steps.

Further another object of the invention is to provide a storage medium in which designing data enabling power consumption and/or a chip occupying area of a module which can be re-used in a semiconductor integrated circuit to be reduced is stored.

Further another object of the invention is to provide a method of fabricating a semiconductor integrated circuit capable of reducing power consumption and/or chip occupying area.

The above and other objects and novel features of the invention will become apparent from the following description of the specification and the attached drawings.

DISCLOSURE OF THE INVENTION

A storage medium according to the invention is a storage medium in which data for designing an integrated circuit to be formed on a semiconductor chip by using a computer is stored so as to be read by the computer. The data stored in the storage medium includes: first data for determining a figure pattern for forming a first circuit out of a plurality of circuits constructing the integrated circuit onto the semiconductor chip; second data for determining a function of a second circuit out of the plurality of circuits constructing the integrated circuit; and third data for determining a relation of connecting the first circuit and the second circuit.

The first data is, for example, data for forming a mask pattern of an integrated circuit. In a manner similar to the data of the hard module, the data has a stable nature from the point such that the functions and performances of a circuit specified by the data are. already verified. By using the first data for designing an integrated circuit, high reliability on the functions and performances can be guaranteed to the first circuit in the integrated circuit with a small number of designing steps.

The second data is, for example, one or plural data selected from a register level, a transistor level, and a net list which determine the function of the second circuit. In a manner similar to the data of the software module, stability of the functions and performances of a circuit specified by the second data is not guaranteed as much as the case of the hardware module. On the other hand, the degree of freedom in designing regarding the driving capability and the like of a circuit is guaranteed. By using the second data for designing the integrated circuit, the degree of freedom in designing regarding the driving capability and the like of the circuit is guaranteed to the second circuit in the integrated circuit and, finally, the figure pattern of the second circuit can be designed.

The third data is, for example, data for associating a terminal name of a terminal included in the first circuit and a net name of a net included in the second circuit. By using the third data for designing an integrated circuit, the figure pattern of the first circuit and the figure pattern of the second circuit designed by using different design data as start points can be integrated.

By loading the data stored in the storage medium into a computer and using the data for designing an integrated circuit, the functions and performances of the circuit can be guaranteed more than the case where all of data is software modules, the degree of freedom in designing can be made higher than the case where all of data is hardware modules, and the number of designing steps can be reduced. Therefore, the invention can increase the efficiency of a process of designing a semiconductor integrated circuit by using a computer.

The data can further include fourth data indicative of characteristics and/or functions of a terminal in the first circuit. Since the terminal of the first circuit is connected to the second circuit, the fourth data becomes data allowing the characteristics and/functions in a terminal of the first circuit to be seen from the second circuit. Consequently, for example, the data can be used as data for verifying the characteristics and/or functions of the circuit including another circuit connected to the second circuit.

When the integrated circuit is constructed by at least one module and other circuits and the first and second circuits construct the one module, the first to third data can be stored in a storage medium, as data of a unit of the module. Consequently, the first to third data can be positioned as part data on the module unit, for example, an IP part.

For example, when the first circuit is a core circuit achieving a predetermined function, the second circuit can take the form of a buffer circuit for interfacing the first circuit to another circuit. It is the best way to use the circuit pattern of which functions and performances are guaranteed as it is for the core circuit often requested to have the high-level functions and performances. In contrast, the functions of the buffer circuit are simpler than those of the first circuit as a core. It is accordingly relatively easy to assure necessary performances. When the circumstances where a circuit of which performances and functions cannot be preliminarily specified is to be connected on the outside of the module are taken into account, by using the first to third data as part data on a module unit basis such as an IP part, while maintaining the functions and performances in the core portion of the module as they are, the interface can be designed so as to address requests of lower power consumption, reduced chip area, and the like in accordance with an external load with the relatively small number of steps.

The third data out of data stored in the storage medium and provided can be entered from an input device of a computer in place of loading the data from the storage medium. In place of the second data, it is also possible to store a program for supporting a process of describing the function of a second circuit to be connected to the first circuit in a computer language together with the first data into a storage medium, and provide the storage medium.

At the time of fabricating a semiconductor integrated circuit having a module including the first circuit and the second circuit, according to a request of a circuit to be connected to the module or a request to the module itself, a step of determining the characteristics of the second circuit is added to the method of fabricating a semiconductor integrated circuit. Consequently, reduction in chip area and/or reduction in power consumption can be realized in accordance with a request.

The step is, for example, for selecting a circuit according to a request from a plurality of circuits having substantially the same function but different driving capabilities, power consumption, and the like. More specifically, when the second circuit is defined at the RTL (Register Transfer Level) in the HDL or the like, description in the HDL or the like corresponds to the second data. By performing logic synthesis between the second data and a cell library for logic synthesis, a net list is generated. The process corresponds to a process of selecting a cell according to a request from the cell library for logic synthesis.

It is also possible to store only the third information into a storage medium and provide the storage medium. In the case where the first and second information is already provided, when the third information for connecting the first and second information is provided, while assuring high reliability as described above, the number of designing steps can be reduced.

BRIEF DESCRIPTION OF DRAWINGS

FIG. 7 is an explanatory diagram showing a list of the IP module data in FIG. 6.

FIG. 8 is an explanatory diagram showing an example in which the first circuit takes the form of a hardware module, the second circuit takes the form of a software module, and the hardware and software modules are different IP modules.

FIG. 9 is an explanatory diagram showing an example of IP module data of the circuit of FIG. 8.

FIG. 10 is an explanatory diagram showing an example of an IP module in which a part having a critical timing and a part requiring no timing adjustment are set as hardware parts, and a part in which timing, area, and power consumption is desired to be adjusted is set as a software part.

FIG. 11 is an explanatory diagram showing an example of IP module data of an IP module in FIG. 10.

FIG. 14 is an explanatory diagram showing an example of IP module data obtained by omitting a hardware part net list.

FIG. 15 is an explanatory diagram showing an example of IP module data obtained by omitting a library for hardware part logic verification and a, library for hardware part logic synthesis.

BEST MODE FOR CARRYING OUT THE INVENTION

Figure 1:
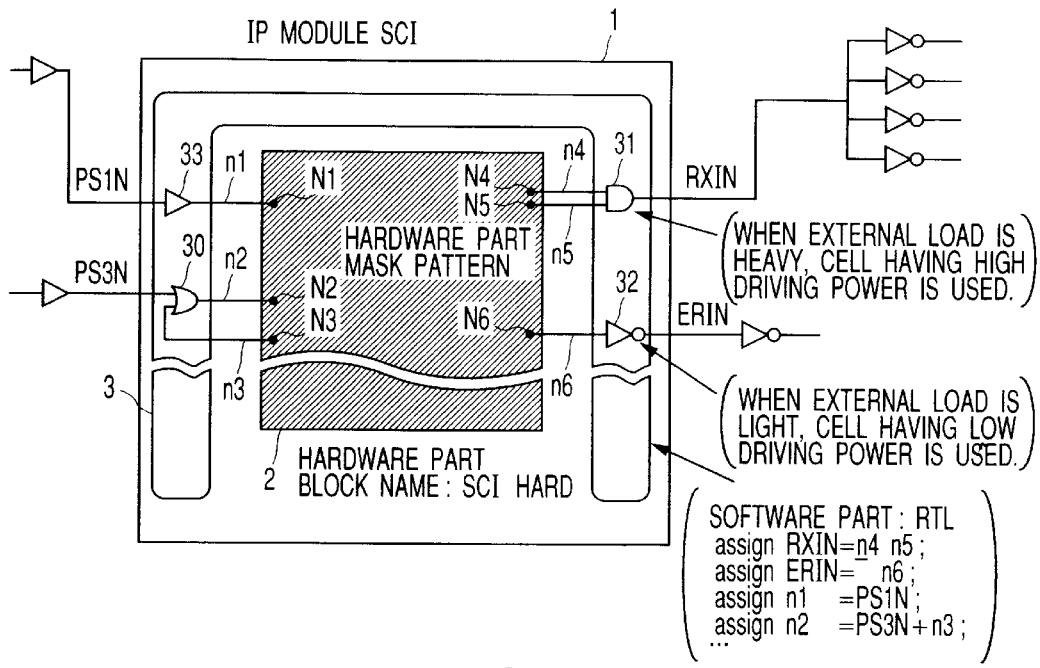
FIG. 1 is an explanatory diagram showing an example of a module specified by data stored in a storage medium according to the invention.

FIG. 1 shows an example of a module specified by data stored in a storage medium according to the invention. A module (hereinbelow, also described as an IP module) 1 shown in the drawing has functions of, for example, CPU, DSP, or the like. Since the detailed functions of a CPU or the like are not directly related to the invention, the detailed description is omitted here.

The IP module 1 is broadly divided into a first circuit 2 and a second circuit 3. The second circuit 3 is, for example, a buffer circuit for interfacing the first circuit 2 to another circuit. The IP module 1 is used as an IP part constructing a part of an integrated circuit.

The first circuit 2 is a circuit part realizing the core function of the IP module 1. The core function denotes a function except for a function of interfacing with the outside or buffering. For example, when the IP module 1 serves as a CPU, the first circuit 2 is constructed as an instruction fetch unit for fetching an instruction to be executed, an instruction decode unit for decoding a fetched instruction, an execution unit for performing operand access or operand computation in accordance with a decode result, and the like.

The second circuit 3 takes the form of an interface circuit or buffer circuit such as an address output register, a data input/output register, a flip flop for a control signal, or a logic gate. The second circuit 3 in FIG. 1 has a 2-input OR gate 30, a 2-input AND gate 31, an inverter 32, and a buffer 33.

In FIG. 1, PS1N and PS3N denote module external input signals shown as representatives, and RXIN and ERIN indicate module external output signals shown as representatives. In FIG. 1, n1 to n6 show net names in the second circuit 3, and N1 to N6 represent terminal names in the first circuit 2.

Figure 2:
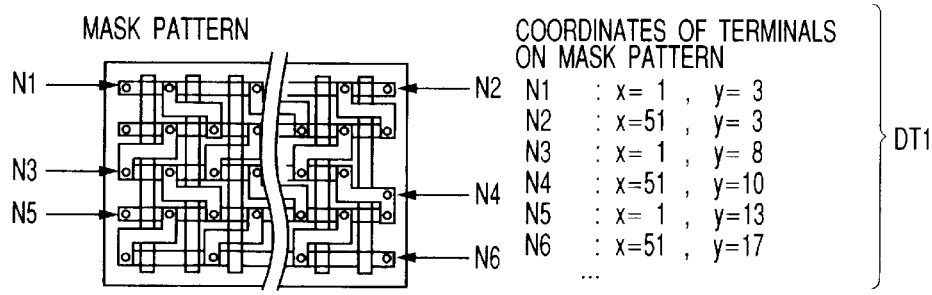
FIG. 2 is an explanatory diagram showing an example of IP module data for specifying an IP module in FIG. 1.

FIG. 2 shows an example of data for specifying the IP module 1 of FIG. 1 (hereinbelow, also described as IP module data). The IP module data shown in the diagram is data for designing an integrated circuit to be formed on a single semiconductor chip by using a computer. The IP module data is stored in a storage medium such as magnetic tape, floppy disk, hard disk, CD-ROM, or MO (magneto-optical disk) so as to be read by a computer.

The IP module data includes first data DT1 for determining a figure pattern to form the first circuit 2 on a semiconductor chip, second data DT3 for determining functions of the second circuit 3, and third data DT3 for determining the relation of connecting the first circuit 2 and the second circuit 3.

The first data DT1 is data for forming a pattern of a mask (mask pattern) used at the time of fabricating a semiconductor integrated circuit, which is, for example, drawing data for forming a mask pattern. The data of the mask pattern is data for specifying a figure pattern for each of layers for forming a circuit such as a semiconductor layer (semiconductor region), a wiring layer, and an insulating layer on a semiconductor chip. For example, the mask pattern data is data of a stream format called GDS2. The data is loaded to a mask designing apparatus or the like which is constructed by an engineering workstation and can generate a photomask pattern. The first data DT1 includes names of terminals in a mask pattern and coordinates of the terminals. In the example of FIG. 2, the coordinates of the terminals N1 to N6 to be connected to the second circuit 3 are shown as representatives. Although not particularly limited, the coordinates use the point P shown in the drawing as an origin. In order to form a semiconductor layer, a wiring layer, and the like on the semiconductor chip, a plurality of masks are used. Although not particularly limited, in the embodiment, terminals are assumed in a mask pattern expressing the pattern of a mask used to form a wiring layer (for example, an aluminum wiring layer). The coordinates of the terminal and the terminal name are provided as data in the first data DT1. Obviously, the terminal here not only denotes a region of one point but also can be regarded as a region having a predetermined physical expansion.

Considering that a layout pattern is formed on a semiconductor chip according to a mask pattern, the data DT1 expresses a layout pattern. It is also possible to regard that the coordinates of the terminal express the coordinates in the layout pattern.

Since the first data DT1 is data verified with respect to functions and performances in a manner similar to the data of the hardware IP module, the first data DT1 has a nature that the functions and performances of a circuit specified by the data are already stabilized ones. By using the first data DT1 for designing an integrated circuit, high reliability with respect to the functions and performances can be guaranteed with the number of designing steps smaller than that of the first circuit 2 in the integrated circuit.

The second data DT2 is data describing the functions of the second circuit 3 in a computer language such as the HDL. In the example of FIG. 2, the functions of the logic gates 30 to 33 shown in FIG. 1 are described by using the net names n1 to n6 and the signal names PSLN, PS3N, RXIN, and ERIN. In a manner similar to data of the software IP module, the stability of the functions and performances of a circuit specified by the second data DT2 is not guaranteed as much as that in the case of the hardware IP module. On the other hand, the degree of freedom in designing regarding the driving capability of a circuit and the like is guaranteed.

For example, in the case where the external load of the inverter 32 is light, it is sufficient to assign a circuit of a relatively low driving capability as the inverter 32. On the other hand, when the external load of the AND gate 31 is heavy, it is sufficient to assign a circuit of a relatively high driving capability as the AND gate 31. As described above, by using the second data DT2 for designing the integrated circuit, while guaranteeing the degree of freedom in designing related to the driving capability of a circuit and the like to the second circuit 3 in the integrated circuit, the figure pattern of the second circuit 3 can be designed finally. When the second data DT2 is changed according to the magnitude of a load to be connected on the outside of the module 1, data for the logic gates 33 and 30 may not be changed. In this case, since a change amount is little, the number of designing steps can be further reduced.

The third data DT3 is, for example, data for associating the terminal names N1 to N6 of the terminals included in the first data DT1 of the first circuit 2 and the net names n1 to n6 of the nets included in the second data DT2 with each other. For example, the net name n1 in the first data DT1 is associated with the terminal name N1 in the second data DT2. By the third data DT3, the relation of connection between the first circuit 2 and the second circuit 3 is specified as shown in FIG. 1. In the third data DT3 in FIG. 2, SCI_HARD U1 (N1 (n1), N2 (n2), , , ) denotes reference to the first data DT1 (having the name of SCI_HARD), at the time of reference, the terminal name N1 is associated with the net name n1, and the terminal name N2 is associated with the net name n2. The third data DT3 is used to integrate (connect) the figure pattern of the first circuit 2 and the figure pattern of the second circuit 3 which are designed by using different design data as start points at the time of designing an integrated circuit. Taking this into account, in description data shown as the second data and the third data, it can be regarded that n1, n2, and the like indicate nodes of the logic circuit in the second circuit 3, for example, an input node and/or output node of the logic circuit.

Figure 3:
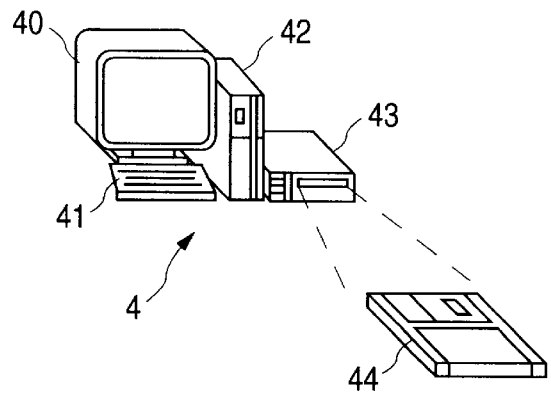
FIG. 3 is an external view showing an example of a computer such as an engineering workstation, a personal computer, or a designing apparatus used for designing an integrated circuit.

FIG. 3 shows an example of a computer such as engineering workstation, personal computer, or designing apparatus used for designing an integrated circuit. A computer 4 shown in FIG. 3 is constructed by connecting peripheral devices typified by a display 40, a keyboard 41, and a disk drive 43 to a main body 42 in which a processor board on which a processor, a memory, and the like are mounted and various interface boards are mounted. The IP module data including the first to third data DT1 to DT3 described in FIG. 2 is stored in a storage medium 44. The storage medium 44 is, although not particularly limited, inserted to the disk drive 43 and the IP module data stored in the storage medium 44 is loaded into the body 42 of the computer. For example, when the read second and third data is description data described in the HDL, the computer decodes it and performs the process. In order to decode the data and perform the process, the computer executes a specific program. The computer may be a distributed processing system. For example, it is also possible to use different computers to process disk access, layout computation, and man-machine interface, link the process results, and use the resultant. When the capacity of the IP module data including the first to third data DT1DT1 to DT3 becomes too large to store the data in a single storage medium 44, the IP module data may be stored into a plurality of storage media. Obviously, the IP module data may be preliminarily divided so as to be stored into a plurality of storage media, and stored into the plurality of storage media.

Figure 5:
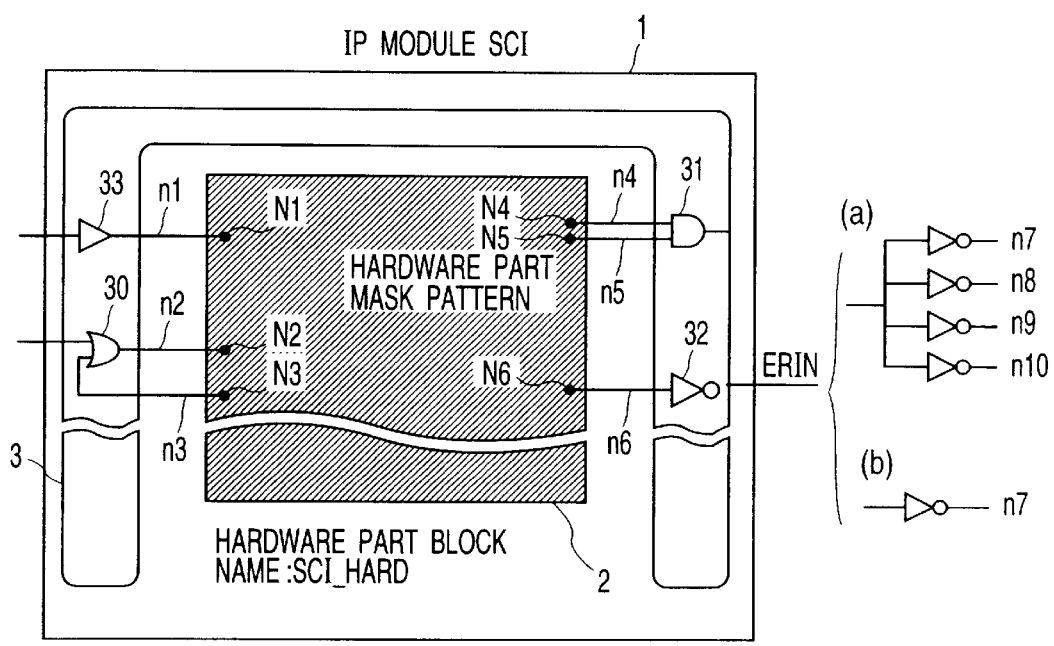
FIG. 5 is an explanatory diagram showing an example of gates of the second circuit to be processed in FIG. 4 and an external load on the second circuit.
Figure 4:
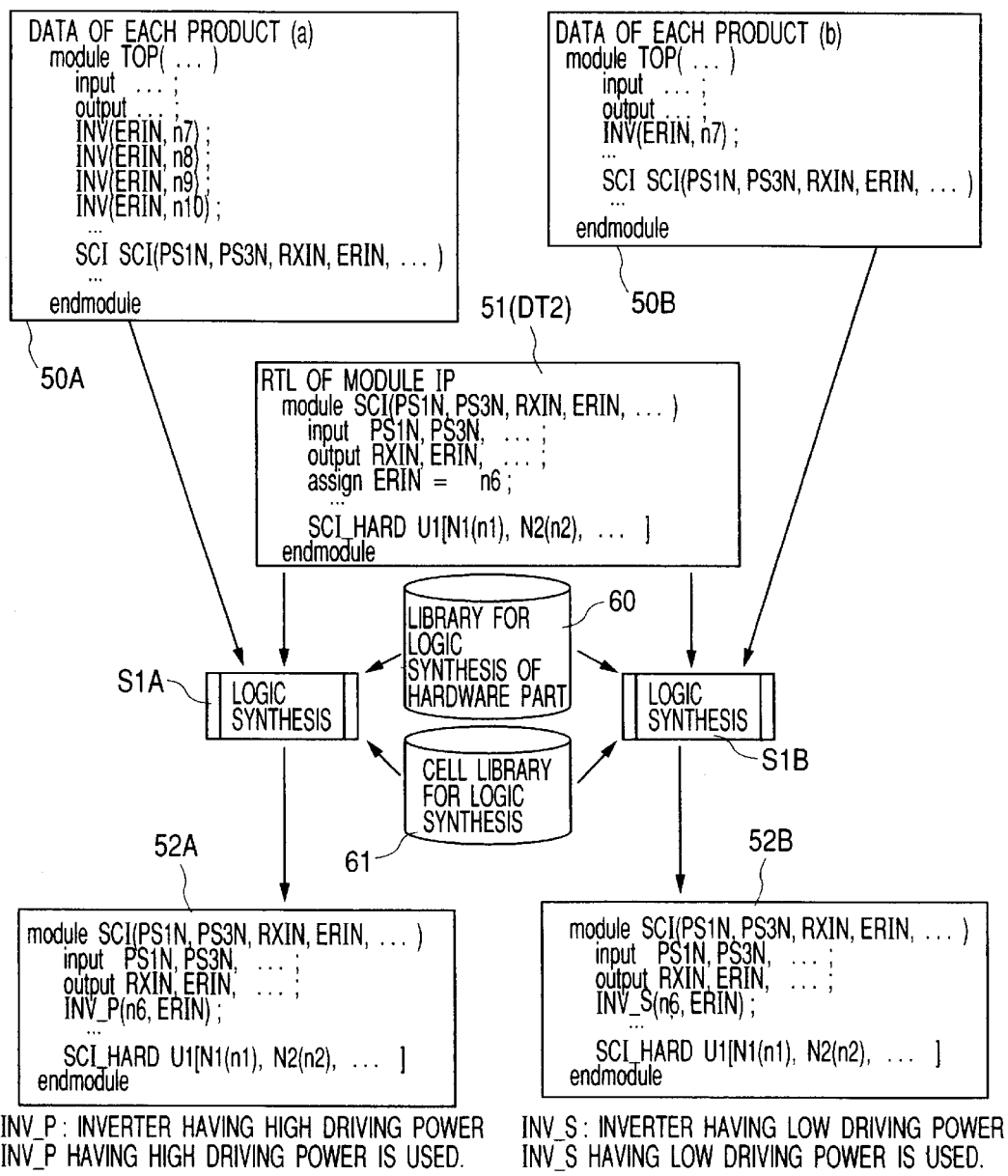
FIG. 4 is a flowchart schematically showing the procedure of a designing process which adopts a circuit according to an external load as a second circuit of the IP module.

FIG. 4 schematically shows the procedure of a designing process adopting a circuit according to an external load of the second circuit 3 in the IP module 1. The process can be positioned as a process included in a part of a process of loading IP module data from the storage medium 44 to the computer 4, and designing a semiconductor integrated circuit such as a microcomputer including the IP module 1 corresponding to the read IP module data as a built-in module. FIG. 4 shows both a process (a) in the case where the external load of the inverter 32 is relatively heavy as shown in FIG. 5 and a process (b) in the case where the external load is relatively light. Although not particularly limited, in the embodiment, the circuit connected on the outside of the module 1 is formed on the same semiconductor chip on which this module is formed. Taking FIG. 5 as an example, four inverter circuits corresponding to the product data (a) and one inverter circuit corresponding to the product data (b) are formed on the same semiconductor chip on which the module 1 is formed. Obviously, whether the four inverter circuits are formed on the same chip or one inverter circuit is formed on the same chip is determined according to a product to be fabricated, that is, determined whether the product (a) or the product (b) is produced.

The data (a) of each product shown by 50A in FIG. 4 is function describing data used in the case of connecting four inverter circuits to the module 1 as shown in FIG. 5 to fabricate the product (a) and shows a case where an external load to be connected to the inverter 32 in the IP module 1 is relatively heavy. On the other hand, the data (b) of each product indicated by 50B in FIG. 4 is function describing data used in the case where one inverter circuit is connected to the module 1 as shown in FIG. 5 to fabricate the product (b) and shows a case where an external load to be connected to the inverter 32 of the IP module 1 is relatively light. In the case of designing a semiconductor integrated circuit such as a microcomputer including the IP module 1 as a built-in module, when an external load of the inverter 32 is heavy, the second data DT2 loaded onto a computer indicated by 51 and data indicated by 50A are subjected to logic synthesis (step S1A). Consequently, the description of second data loaded on the computer is modified as shown by 52A so as to adopt an inverter INV_P having high driving capability as the inverter 32 of the second circuit 3. On the other hand, in the case of designing a semiconductor integrated circuit, also-when an external load of the inverter 32 is light, the second data DT2 loaded on the computer indicated by 51 and the data indicated by 50B are subjected to logic synthesis (step S1B). In this case, since it is determined from the data 50B that the external load of the inverter 32 is relatively light, the description of the second data loaded on the computer is modified so as to adopt an inverter INV_S of low driving capability as shown by 52B. Specifically, when it is determined that a load is relatively heavy (product data (a)), the description part (assign ERIN=¯n6) of the inverter circuit 32 specified in a module SCI called from product data is converted to the inverter INV_P of high driving capability. When it is determined that a load is relatively light (product data (b)), the description part is converted to the inverter INV_S of low driving capability. In logic synthesizing processes (S1A and S1B), the driving capability of the inverter 32 is estimated by referring to the terminal load capacitative component of a library 60 for hardware part logic synthesis and terminal timing information of a terminal, which will be described in detail hereinlater. A device such as INV_P or INV_S satisfying the estimated driving capability is retrieved from a cell library 61 for logic synthesis and is employed.

Figure 6:
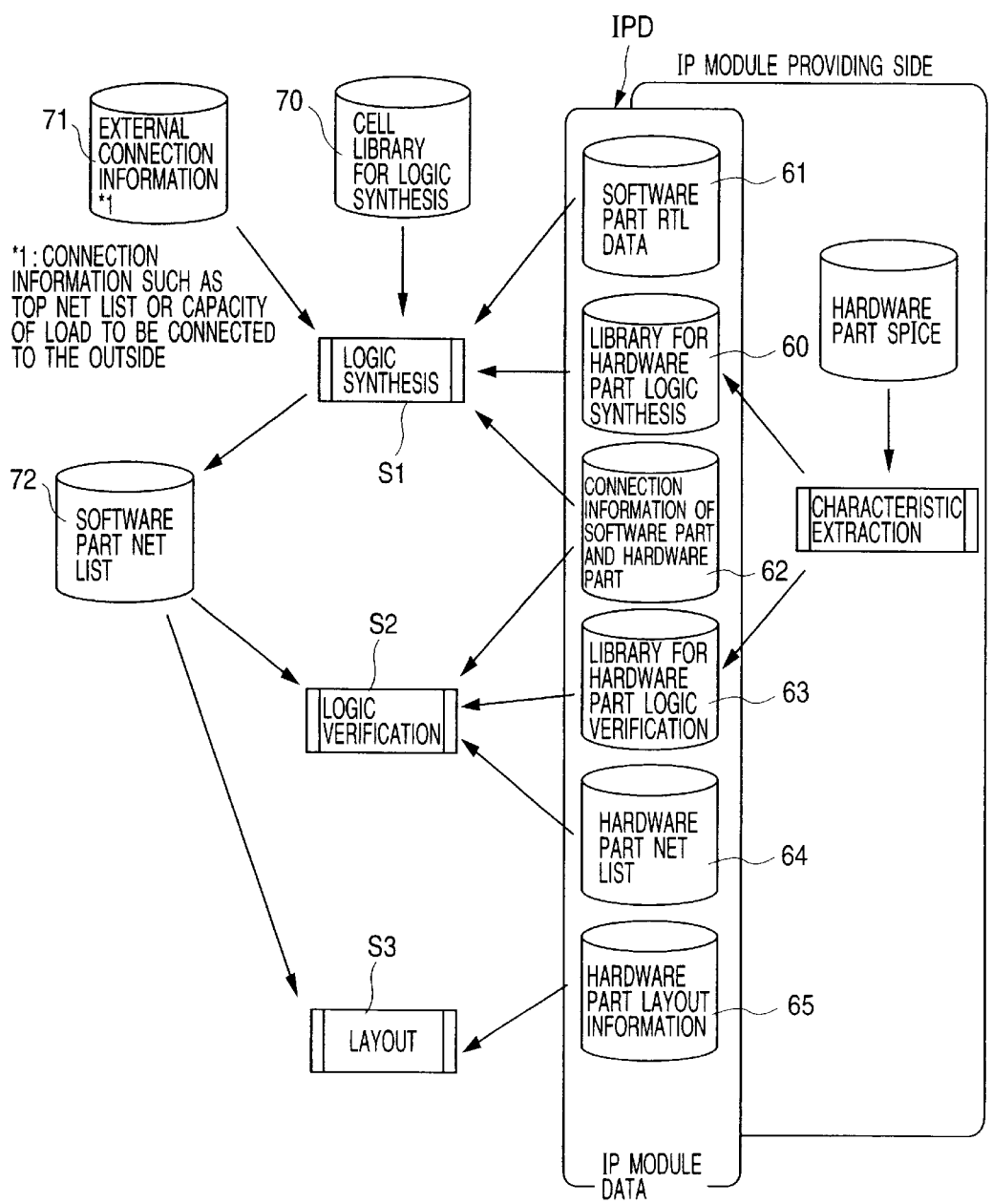
FIG. 6 is a flowchart showing a general process of designing a semiconductor integrated circuit by using IP module data.

FIG. 6 shows a general process of designing a semiconductor integrated circuit by using the IP module data. FIG.

7 shows a list of IP module data IPD of FIG. 6. The method en of performing the designing process shown in FIGS. 4, 6, and the like can be also regarded as a method of fabricating a semiconductor integrated circuit since a semiconductor integrated circuit is fabricated by using a mask pattern formed by the designing method.

In FIGS. 6 and 7, IP module data is designated by the reference characters IPD. The IP module data IPD includes software part RTL data 61, the library 60 for hardware part logic synthesis, connection information 62 of hardware part and software part, a library 63 for hardware part logic verification, a hardware part net list 64, and hardware part layout information 65. The IP module data IPD is data for each IP module such as a CPU. In the drawings, the software part denotes data describing functions and corresponds to the second data DT2, and the hardware part denotes data for specifying a figure pattern and corresponds to the first data DT1 such as mask mask pattern data.

The software part RTL data 61 includes data which describes functions of a circuit in, for example, the HDL, and includes function description data which describes functions of a circuit at a description level (RTL) at which a net list of the circuit can be generated by performing logic synthesis on the description data. The second data DT2 is a part of the software part RTL data 61.

The library 60 for hardware part logic synthesis and the library 63 for hardware part logic verification have data preliminarily obtained by verifying timings at an actual load for the hardware part, and has information of signal input/output timings of terminals, input capacitative components, and the like of terminals in the hardware part. The former is used for the logic synthesis S1 (S1A, S1B), and the latter is used for logic verification (S2). Although information formats of both of the information are different from each other, the contents of the information are similar to each other. The library 60 for hardware part logic synthesis and the library 63 for hardware part logic verification include fourth data DT4 indicative of signal input/output timings in the terminals of the first circuit 2, input capacitative component of a terminal, load driving capability of a terminal, logic functions, and the like. Since the terminal of the first circuit 2 serves as a terminal of connection to the second circuit 3, the fourth data DT4 can be grasped as data of allowing the characteristics and/or logic functions in a terminal of the first circuit 2 to be seen from the second circuit 3.

The connection information 62 of hardware part and software part includes the third data DT3.

The hardware part layout information 65 includes the first data DT1. The hardware part net list 64 includes information of a net list.

The user of the IP module data IPD (for example, a designer of a semiconductor integrated circuit) employs IP modules specified by the IP module data IPD for one circuit to design an integrated circuit. The user prepares a cell library 70 for logic synthesis, and external connection information 71. The external connection information 71 is connection information between an IP module and the outside. As the external connection information 71, information of the highest-order net list of the integrated circuit to be designed can be used. The information includes, for example, information such as the data 50A and 50B of each product of FIG. 4. In a logic synthesizing process S1, as described by referring to FIG. 4, processes such as allocation of the logic cells to the second circuit 3 in the IP module 1 and connection of the second circuit 3 in the IP module 1 to the outside are performed, and a software part net list 72 is generated.

In a logic verifying process (S2), logic verification is performed on the IP module 1 in relation with the other circuits. A signal interface state between the second circuit 3 in the IP module 1 and the outside of the IP module 1 and the like can be grasped by using the software part net list 72, software part and hardware part connection information 62, library 63 for hardware part logic verification, and hardware part net list 64.

After the logic verification, the layout of an overall integrated circuit is designed by using the software part net list 72, hardware part layout information 65, and the like which have been subjected to the logic verification (S3). In the case where the relation of connection between terminal coordinates of the hardware part typified by the first circuit 2 and the net name in the software part typified by the second circuit 3 is necessary, it is sufficient to refer to the software part and software part connection information 62 typified by the third information.

As described above, by loading the data stored in the storage medium 44 to the computer 4 and using the data for designing an integrated circuit, the functions and performances of a circuit can be guaranteed more than the case where all of data is software IP modules, the degree of freedom in designing is higher than the case of the hardware IP module, and the number of layout steps can be also reduced. Therefore, increase in efficiency of the process of designing a semiconductor integrated circuit by using the computer 4 can be realized.

Further, in the above-described example, one IP module 1 positioned as a part of designing an integrated circuit is constructed by including the first circuit 2 and the second circuit 3. In this case, the first circuit 2 is used as a core circuit for achieving predetermined functions, and the second circuit 3 is a buffer circuit for interfacing the first circuit 2 to another circuit. It is the best way to use the circuit pattern of which functions and performances are guaranteed as it is for the core circuit requested to have the high-level functions and performances. In contrast, the functions of the buffer circuit are simpler than those of the first circuit 2 as a core. It is accordingly relatively easy to assure necessary performances. When the circumstances where a circuit of which performances and functions cannot be preliminarily specified is to be connected on the outside of the IP module are taken into account, by using the IP module 1 as part data on a module unit basis, while maintaining the functions and performances in the core portion of the module as they are, the interface can be designed so as to address requests of lower power consumption, reduced chip area, and the like in accordance with an external load with the relatively small number of steps. As described above, the IP module data has the hardware part and the software part (described in the HDL or the like), the part which requires adjustment such as an interface part takes the form of a software part and has the degree of freedom. Consequently, at the time of designing an integrated circuit, partial modification on past design asset data such as promotion of reduction in power consumption or reduction in chip occupying area in accordance with an external load can be easily made.

FIG. 8 shows a configuration example in which the first circuit 2 takes the form of a hardware IP module, the second circuit 3 takes the form of a software IP module, and the IP modules are different from each other. The pair of IP modules are integrated to realize a single function (one module), and it is expected that the pair of IP modules are integrally used. Consequently, in IP module data of the circuit of FIG. 8, as shown in FIG. 9, the third information DT3 is always attached to the first information DT1 which determines a layout pattern of the first circuit 2 and the second information DT2 which determines the function of the second circuit 3. The third information DT3 is, for example, information of connecting IP modules to each other when the terminal name of a hardware IP module indicative of the first circuit 2 and the net name of a software IP module indicative of the second circuit 3 are the same. When the terminal name and the net name are different from each other, it is sufficient to provide information (data) defining a relation of connecting them as shown in FIG. 2.

From a different point of view, when the third information DT3 as described above is provided to a plurality of IP modules, even when the IP modules are separately provided, they can be regarded as IP modules which are scheduled to be integrally used. Further, IP modules which are provided as IP modules different from each other can be used as integrated IP modules by the third information. In this case, it can be also regarded that the value as the assets of the IP modules increases.

FIG. 10 shows another example of the first and second circuits. Although the second circuit 3 has been a buffer circuit in the above description, the invention is not limited to the buffer circuit. As shown in FIG. 10, a part having a critical timing and a part in which a timing and the like is not adjusted take the form of hardware parts (first circuit 2), a part in which timing, area, or power consumption is desired to be adjusted takes the form of a software part (second circuit 3) described in the HDL and/or at a gate level or the like. In such a manner, a single IP module can be constructed. FIG. 11 shows an example of data of the IP module.

A CPU module is used as an example of the IP module 1 of FIG. 10. The IP module of the CPU includes an address decoder 20, a μROM 21, an IO (input/output) control unit 22, a register 23, an ALU (computing unit) 24, an instruction decoder 35, an instruction fetch unit 36, and a plurality of input/output gates 37A to 37E. In this example, the instruction decoder 35, instruction fetch unit 36, and the plurality of input/output gates 37A to 37E take the form of software parts and are expressed by function description data in a manner similar to the second circuit 3. The other parts take the form of hardware parts and are provided by including the mask pattern data in a manner similar to the first circuit 2. In this case, at the time of designing an integrated circuit, the timing and the area of the instruction decoder 35 and the instruction fetch unit 36 can be adjust in accordance with the operating frequency. For example, since a timing is tight in the case where a semiconductor integrated circuit to be designed is to be operated at a high frequency, the instruction decoder 35 and the instruction fetch unit 36 are subjected to logic synthesis by placing importance on the timing. On the other hand, in the case where a semiconductor integrated circuit to be designed is to be operated at a low frequency, the timing is not tight, so that the instruction decoder 35 and the instruction fetch unit 36 are subjected to. logic synthesis by placing importance on reduction in the chip occupying area. For example, in the case of performing the logic synthesis by placing importance on the timing, at the time of logic synthesis, a logic gate of a relatively large physical size is selected. When importance is placed on reduction in the occupied area, a logic gate of a relatively small physical size is selected. For the input/output gates 37A to 37E, the logic synthesis is performed, for example, from the viewpoint described in FIG. 1.

Figure 12:
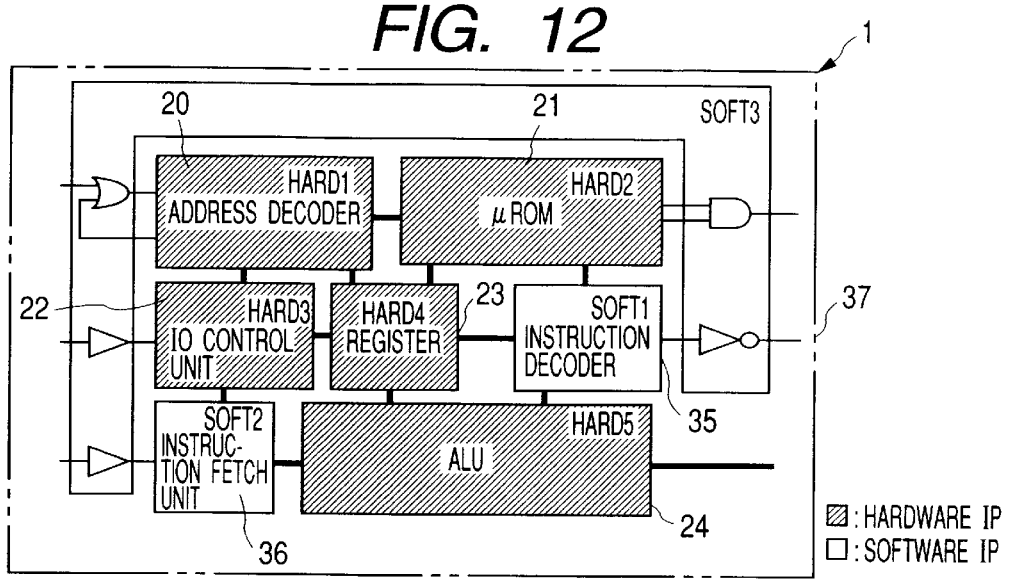
FIG. 12 is an explanatory diagram showing an example in which a first circuit of FIG. 10 takes the form of a hardware module, a second circuit takes the form of a software module, and the hardware and software modules are different IP modules.
Figure 13:
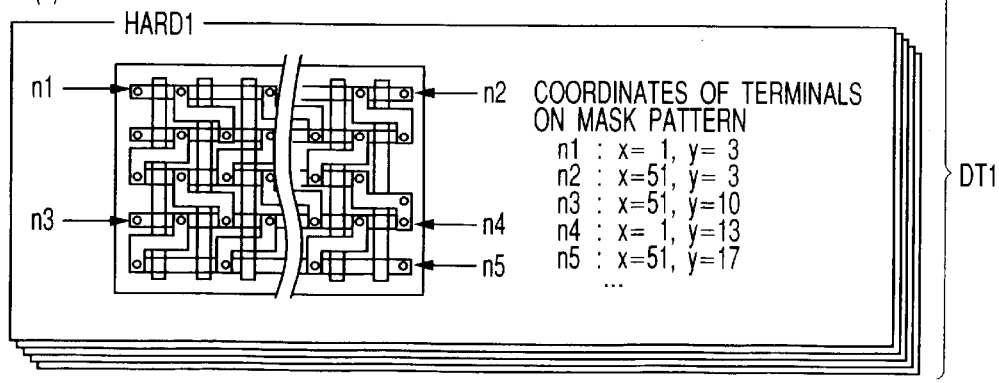
FIG. 13 is an explanatory diagram showing an example of IP module data of the circuit of FIG. 12.

FIG. 12 shows an example in which the first circuits 2 (20 to 24) in FIG. 10 take the form of hardware modules, the second circuits 3 (35 to 37) take the form of software modules, and the modules are different from each other. The IP modules constructing a CPU are integrated to realize a single function and are scheduled to be integrally used from the beginning. This relation is the same as that of FIG. 8 with FIG. 1. In IP module data of the circuit of FIG. 12, as shown in FIG. 13, the third information DT3 is always attached to the first information DT1 which determines the layout pattern of the first circuit 2 and the second information DT2 which determines the function of the second circuit 3. Obviously, it is unnecessary to provide the first information DT1, second information DT2, and third information DT3 stored in a storage medium. It is possible to provide the pieces of information stored in different storage media. Since the third information DT3 is used to connect the first and second information, this case also corresponds to the case where the modules are used integrally.

FIG. 14 shows another example of the IP module data which is obtained by omitting the hardware part net list 64 from FIG. 6. Logic verification S2 can be performed only by information of the library 63 for hardware part logic verification. It is expected that the data amount of the IP module data decreases but time required for logic verification increases a little.

FIG. 15 shows further another example of the IP module data which is obtained by omitting the library 63 for hardware part logic verification and the library 60 for hardware part logic synthesis from FIG. 6. The hardware part net list 64 can be also used for the logic synthesis S1 and logic verification S2 without using libraries, thereby enabling the data amount of the IP module data to be decreased. In this case, however, there is the possibility that a desired result cannot be obtained at the time of logic synthesis and it is feared that the precision of the logic verification deteriorates. In the embodiments of FIGS. 14 and 15, the data amount can be reduced, so that the storage capacity of the storage medium can be effectively used.

Figure 16:
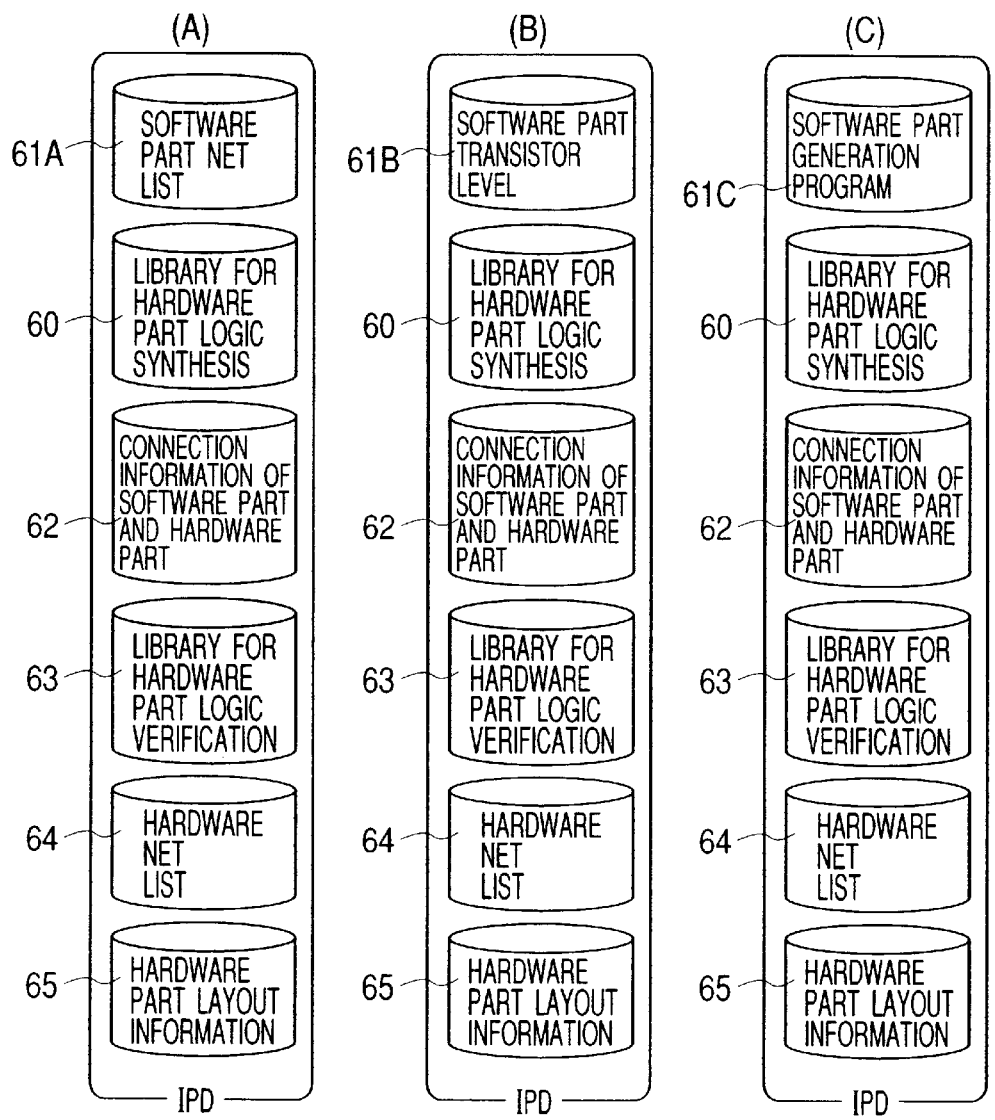
FIG. 16 is an explanatory diagram showing further another example of IP module data.

FIG. 16 shows further another example of the IP module data. The second data DT2 in the software part such as the second circuit 3 is not limited to the function description of the RTL such as the software part RTL data 61 in FIG. 6 but may be software part net list data 61A as indicated by (A) or software part transistor level data 61B as indicated by (B). Further, it may be a software part generation program indicated by (C) The software part generation program 61C is a program for supporting a process of generating the functions of the second circuit 3 to be connected to the first circuit in a computer language. As the program, for example, a known utility program such as a logic circuit diagram editor can be employed. The program is stored together with the first data such as hardware part layout information onto a storage medium, and the storage medium is provided to the user of the IP module. By loading the program into a computer and executing the program, the second data of the second circuit can be generated on the computer.

Although the invention achieved by the inventors of the present invention has been specifically described on the basis of the embodiments, the invention is not limited to the embodiments but can be variously modified within a range not departing from the gist.

For example, the third data out of the data stored in the storage medium and provided may be entered by an input device (such as a keyboard) of the computer in place of loading the data from the storage medium.

Alternately, only the third information may be stored in the storage medium and provided to connect already provided first and second information.

The example of the. IP module in which the interface part takes the form of a software part described in the HDL and the inside takes the form of a hardware part, the example in which the part requiring adjustment takes the form of the software part and the part having a critical timing and the like takes the form of the hardware part, and the example in which the part requiring adjustment takes the form of one or a plurality of software IP modules and the part having a critical timing and the like takes the form of one or a plurality of hardware IP modules have been described. It is also possible to divide module data into first data and second data while considering other required factors.

It is also possible to design a semiconductor integrated circuit by supplying the information stored in a storage medium via a communication path and using the supplied information. Further, it is also possible to store the information supplied via the communication path into the storage medium and design a semiconductor integrated circuit by using the stored information.

As the HDL, for example, VDHL (VSHIC hardware description language) which is a standard as IEEE1076, Verilog-HDL which is being standardized as IEEE1364, or the like can be used.

According to the foregoing embodiments, the following effects can be obtained.

The IP module data has the hardware part which defines a figure pattern of an integrated circuit and a software part for determining the functions of a circuit (information described in the HDL or the like). The part requiring adjustment such as an interface part takes the form of the software part which has data and the degree of freedom. Consequently, at the time of designing an integrated circuit, partial modification on design asset data such as promotion of reduction in power consumption in accordance with an external load or reduction in chip occupying area can be easily made.

Therefore, by loading the data of the storage medium according to the invention into a computer and using the data for designing an integrated circuit, the functions and performances of the circuit can be guaranteed more than the case where all of modules are software modules, the degree of freedom in designing is higher than the case where all of modules are hardware modules, and the number of designing steps can be also reduced.

In place of the software part, when a program for supporting the process of describing the circuit function in a computer language is stored in a storage medium, the circuit part can be generated on the computer. By using the program, effects similar to the above can be obtained.

Industrial Applicability

The invention can be used not only in the case of designing an integrated circuit when a product such as a microcomputer is developed but also in the case of developing other integrated circuits and a quite new integrated circuit. Further, a storage medium may be an auxiliary storage such as a hard disk assembled in a computer, a file memory removable from a computer, or the like. Initial storage of data into a storage medium may be performed via a communication line or a communication network.

What is claimed is:

1. A storage medium in which data for designing an integrated circuit to be formed on a semiconductor chip by using a computer is stored so as to be read by said computer, wherein the data stored in said storage medium includes:

first data, that is hardware data, for determining a figure pattern for forming a first circuit out of a plurality of circuits constructing said integrated circuit onto said semiconductor chip;

second data, that is software data, for determining a function of a second circuit, coupled to said first circuit, out of the plurality of circuits constructing said integrated circuit; and third data for determining a relation of connecting said first circuit and said second circuit.

2. A storage medium according to claim 1, wherein said first data is data for determining a pattern of a mask used at the time of forming an integrated circuit.

3. A storage medium according to claim 2, wherein said second data is description data which describes a function of said second circuit in a hardware description language.

4. A storage medium according to claim 2, wherein said third data is data indicative of correspondence between a terminal name of a terminal in said pattern and a net name of a net in said second circuit included in said second data.

5. A storage medium according to claim 4, wherein fourth data indicative of characteristics of a terminal in said first circuit is included.

6. A storage medium according to claim 5, wherein said fourth data is data used to verify said integrated circuit.

7. A storage medium according to claim 1, wherein said integrated circuit is constructed by at least one module and other circuits, said first and second circuits construct said one module, and said first to third data is data of a unit of said module.

8. A storage medium according to claim 1, wherein said first circuit is a circuit achieving a predetermined function, and said second circuit is a buffer circuit for interfacing said first circuit to another circuit.

9. A storage medium according to claim 1, wherein said second data is one or plural data selected from a register level, a transistor level, and a net list which determine the function of said second circuit.

10. A storage medium in which data for designing an integrated circuit to be formed on a semiconductor chip by using a computer is stored so as to be read by said computer, wherein the data stored in said storage medium includes:

first data for determining a figure pattern for forming a first circuit out of a plurality of circuits constructing said integrated circuit onto said semiconductor chip;

second data for determining a function of a second circuit out of the plurality of circuits constructing said integrated circuit; and third data for determining a relation of connecting said first circuit and said second circuit, wherein said second data is description data which describes a function of said second circuit in a hardware description language, and wherein said third data is data indicative of correspondence between an area in said pattern and a node of a logic circuit specified by description in said description data.

11. A storage medium in which an IP mode used at the time of designing a semiconductor integrated circuit by using a computer is stored, wherein one IP module stored in said storage medium includes:

first data, that is hardware data, indicative of a pattern of a mask used at the time of forming a first circuit on a semiconductor chip; and second data, that is software data, which determines a function of a second circuit which is different from said first circuit and which is coupled to the first circuit.

12. A storage medium according to claim 11, wherein said second data is description data of the function of said second circuit described in a language which can be read by said computer.

13. A storage medium according to claim 12, wherein said language is a hardware description language.

14. A storage medium according to claim 12, wherein said one IP module is stored in a single storage medium.

15. A storage medium in which data used for designing a semiconductor integrated circuit having a first circuit and a second circuit different from said first circuit is stored, wherein the data stored in said storage medium includes third data indicative of correspondence between an area in a pattern of a mask used at the time of forming said first circuit and a node in said second circuit specified by second data in first data for determining a function of said second circuit.

16. A storage medium according to claim 15, wherein said first data is description data defining said second circuit in a language which can be decoded by a computer used at the time of designing said semiconductor integrated circuit.

17. A storage medium according to claim 16, wherein said area has a name, said second data expresses a net in said second circuit, and correspondence between a net name of said net and said name is included in said third data.

18. A storage medium according to claim 17, wherein data indicative of a pattern of said mask is a first IP module, and said first data is a second IP module different from said first IP module.

19. A storage medium in which data and a program for designing an integrated circuit to be formed on a semiconductor chip by using a computer are stored so as to be read by said computer, wherein the data stored in said storage medium includes first data, that is hardware data, for determining a figure pattern for forming a first circuit out of a plurality of circuits constructing said integrated circuit onto said semiconductor chip, and the program stored in said storage medium is to support a process of generating, by software data, a function of a second circuit which is a circuit in the plurality of circuits constructing said integrated circuit and is to be connected to said first circuit, in a computer language.

20. A method of fabricating a semiconductor integrated circuit having a first circuit and a second circuit to be connected to said first circuit, comprising providing first data, that is hardware data, indicative of a pattern of a mask used for forming said first circuit and second data, that is software data, for specifying said second circuit, and a logic synthesizing step which receives said second data and a cell library for logic synthesis, selects a cell from said cell library for logic synthesis in accordance with a request to said second circuit, and generates third data for specifying said second circuit.

21. A method of fabricating a semiconductor integrated circuit according to claim 20, wherein in said logic synthesizing step, fourth data for specifying a third circuit which is included in said semiconductor integrated circuit and is to be connected to said second circuit is supplied, and a request to said second circuit is determined from said fourth data.

22. A method of fabricating a semiconductor integrated circuit according to claim 21, wherein said second data has description data described in a language which can be decoded by a computer used in fabrication of said semiconductor integrated circuit, and said third data has a net list.

23. A method of fabricating a semiconductor integrated circuit according to claim 20, wherein said second data has description data described in a language which can be decoded by a computer used in fabrication of said semiconductor integrated circuit, and said third data has a net list.

24. A method of fabricating a semiconductor integrated circuit having a first circuit and a second circuit to be connected to said first circuit, comprising a logic synthesizing step of providing first data indicative of a pattern of a mask used for forming said first circuit and second data for specifying said second circuit, receiving said. second data and a cell library for logic synthesis, selecting a cell from said cell library for logic synthesis in accordance with a request to said second circuit, and generating third data for specifying said second circuit, wherein said cell library for logic synthesis has, as cells, a plurality of logic circuits having the same function but different electric characteristics.

25. A method of fabricating a semiconductor integrated circuit having a first circuit and a second circuit to be connected to said first circuit, comprising a logic synthesizing step of providing first data indicative of a pattern of a mask used for forming said first circuit and second data for specifying said second circuit, receiving said second data and a cell library for logic synthesis, selecting a cell from said cell library for logic synthesis in accordance with a request to said second circuit, and generating third data for specifying said second circuit, wherein in said logic synthesizing step, fourth data for specifying a third circuit which is included in said semiconductor integrated circuit and is to be connected to said second circuit is supplied, and a request to said second circuit is determined from said fourth data, and wherein said cell library for logic synthesis has, as cells, a plurality of logic circuits having the same function but different electric characteristics.

* * * * *